(12) United States Patent
Chun

(10) Patent No.: US 10,565,055 B2
(45) Date of Patent: Feb. 18, 2020

(54) SEMICONDUCTOR MEMORY DEVICE INCLUDING AN ERROR CORRECTION CODE CIRCUIT

(71) Applicant: SK hynix Inc., Icheon-si Gyeonggi-do (KR)

(72) Inventor: Duk Su Chun, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 48 days.

(21) Appl. No.: 15/681,082

(22) Filed: Aug. 18, 2017

(65) Prior Publication Data

US 2018/0181463 A1    Jun. 28, 2018

(30) Foreign Application Priority Data

Dec. 22, 2016  (KR) .................. 10-2016-0176635

(51) Int. Cl.
| | | |
|---|---|---|
| *G06F 11/10* | (2006.01) | |
| *G11C 29/52* | (2006.01) | |
| *G11C 29/04* | (2006.01) | |

(52) U.S. Cl.
CPC ........ *G06F 11/108* (2013.01); *G06F 11/1048* (2013.01); *G06F 11/1068* (2013.01); *G11C 29/52* (2013.01); *G11C 2029/0411* (2013.01)

(58) Field of Classification Search
CPC ............................ G06F 11/108; G06F 11/1068
See application file for complete search history.

(56) References Cited

U.S. PATENT DOCUMENTS

| | | | | |
|---|---|---|---|---|
| 3,735,368 A | * | 5/1973 | Beausoleil ............. | G11C 29/76 365/200 |
| 4,604,749 A | * | 8/1986 | Shinoda .............. | G06F 11/1008 714/49 |
| 4,703,453 A | * | 10/1987 | Shinoda .............. | G06F 11/1008 365/104 |
| 4,943,967 A | * | 7/1990 | Shinoda .............. | G06F 11/1008 714/702 |
| 5,134,616 A | * | 7/1992 | Barth, Jr. ............ | G06F 11/1008 714/710 |
| 5,177,743 A | * | 1/1993 | Shinoda .............. | G06F 11/1008 365/200 |
| 7,603,592 B2 | | 10/2009 | Sekiguchi et al. | |
| 7,890,843 B2 | * | 2/2011 | Toda ................... | G06F 11/1068 714/782 |
| 7,941,733 B2 | * | 5/2011 | Toda ................... | G06F 11/1068 714/781 |
| 8,201,055 B2 | * | 6/2012 | Toda ................... | G06F 11/1068 714/773 |
| 10,013,308 B2 | * | 7/2018 | Park .................... | G06F 11/1068 |

(Continued)

*Primary Examiner* — Joseph D Torres
(74) *Attorney, Agent, or Firm* — William Park & Associates Ltd.

(57) ABSTRACT

A semiconductor memory device may be disclosed. The semiconductor memory device may include a first memory cell array region and a second memory cell array region, each of which includes memory cells. The semiconductor memory device may include a column driving (Y-HOLE) region disposed between the first memory cell array region and the second memory cell array region. The Y-HOLE region may include an error correction code (ECC) block configured for performing error correction.

13 Claims, 3 Drawing Sheets

(56) References Cited

U.S. PATENT DOCUMENTS

| | | | | |
|---|---|---|---|---|
| 2001/0010654 A1* | 8/2001 | Shau | ............... | G11C 7/1006 |
| | | | | 365/222 |
| 2002/0039317 A1* | 4/2002 | Shau | ............... | G11C 7/1006 |
| | | | | 365/222 |
| 2003/0008446 A1* | 1/2003 | Osada | ............ | G06F 11/1008 |
| | | | | 438/200 |
| 2004/0184327 A1* | 9/2004 | Okuda | ............. | G11C 29/42 |
| | | | | 365/199 |
| 2006/0034142 A1* | 2/2006 | Ooishi | ............... | G11C 8/10 |
| | | | | 365/230.06 |
| 2007/0038919 A1* | 2/2007 | Sekiguchi | ...... | G06F 11/1044 |
| | | | | 714/763 |
| 2007/0198902 A1* | 8/2007 | Toda | ............. | H03M 13/152 |
| | | | | 714/782 |
| 2007/0220400 A1* | 9/2007 | Toda | ............. | G06F 11/1068 |
| | | | | 714/763 |
| 2014/0036569 A1* | 2/2014 | Yoon | ............. | G06F 11/1048 |
| | | | | 365/148 |

* cited by examiner

SEMICONDUCTOR MEMORY DEVICE INCLUDING AN ERROR CORRECTION CODE CIRCUIT

CROSS-REFERENCE TO RELATED APPLICATION

The priority of Korean patent application No. 10-2016-0176635 filed on 22 Dec. 2016, the disclosure of which is hereby incorporated in its entirety by reference, is claimed.

BACKGROUND

1. Technical Field

Embodiments of the present disclosure may generally relate to a semiconductor memory device, and more particularly to a semiconductor memory device relating to an error correction code (ECC) circuit and formation of an ECC-On-Chip semiconductor memory device.

2. Related Art

A semiconductor memory device is implemented using a semiconductor material such as silicon (Si), germanium (Ge), germanium (Ge), gallium arsenide (GaAs), indium phosphide (InP), etc. Semiconductor memory devices are generally classified into a volatile memory device such as DRAM or SRAM and a non-volatile memory device such as a flash memory or magnetic RAM (MRAM).

When the semiconductor memory device stores data and reads the stored data, error bits may unavoidably occur. Therefore, various methods for detecting and correcting such errors in the semiconductor memory device have been widely used. For example, an error correction code (ECC) circuit for error correction may be contained in a memory controller that is coupled between a host and the semiconductor memory device to access the semiconductor memory device upon receiving a request from the host.

Recently, many developers and companies are conducting intensive research into a method for overcoming or preventing defective or faulty parts of the semiconductor memory device.

SUMMARY

In accordance with an aspect of the present disclosure, a semiconductor memory device may be provided. The semiconductor memory device may include a first memory cell array region and a second memory cell array region, each of which includes memory cells configured for storing data. The semiconductor memory device may include a column driving (Y-HOLE) region disposed between the first memory cell array region and the second memory cell array region, and may include an error correction code (ECC) block configured for performing error correction of data stored in the memory cells.

DETAILED DESCRIPTION

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Various embodiments of the present disclosure may be directed to providing a semiconductor memory device including an error correction code circuit that substantially obviates one or more problems due to limitations and disadvantages of the related art.

An embodiment of the present disclosure may generally relate to a semiconductor memory device configured to provide a new layout structure capable of guaranteeing reliability of the semiconductor memory device when the ECC circuit is applied to the chip of the semiconductor memory device.

Figure 1:
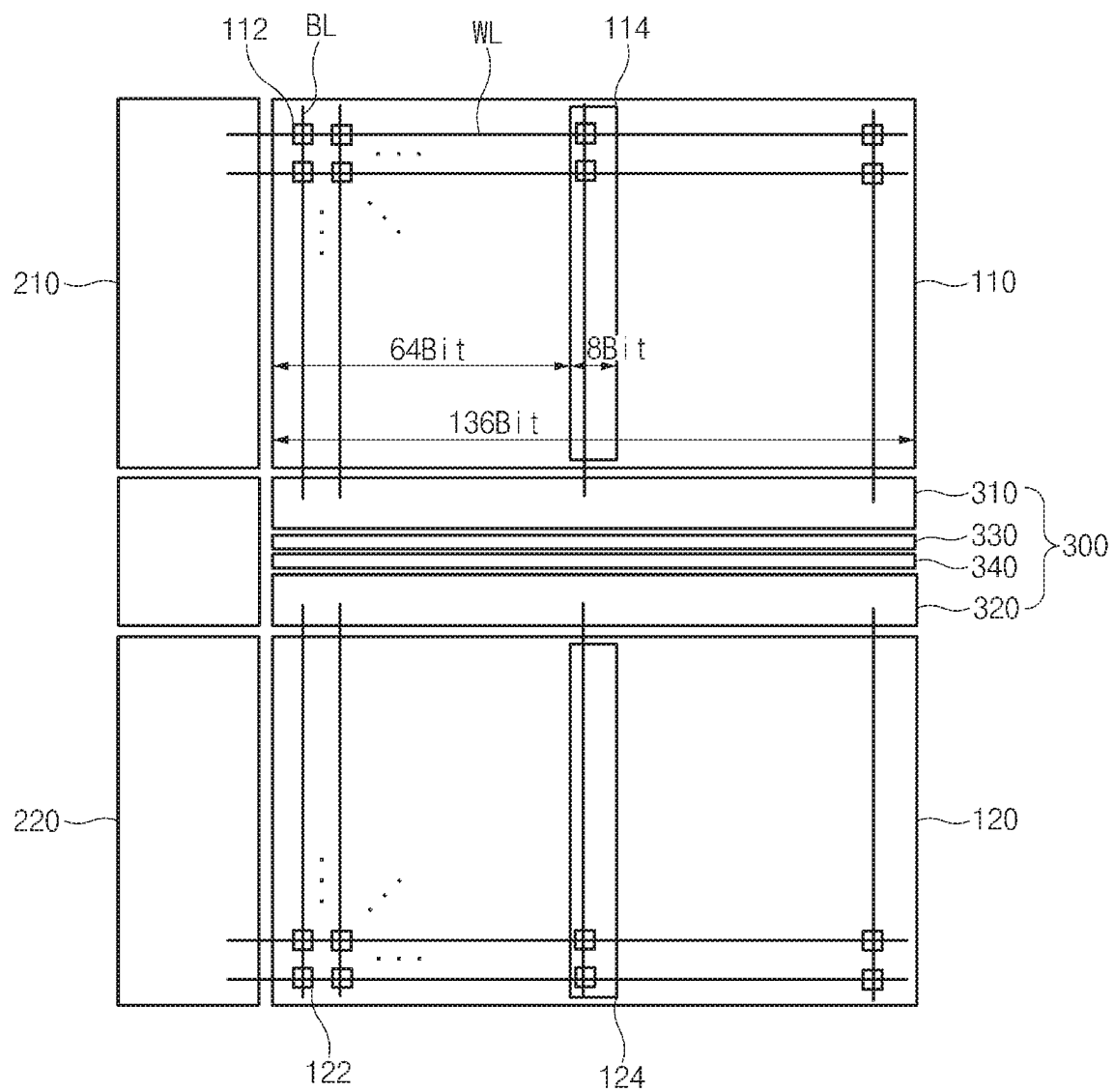
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device includes memory cell array regions 110 and 120, row driving regions 210 and 220, and a column driving region 300.

The memory cell array regions 110 and 120 include a plurality of memory cells 112 configured to store data and arranged in a matrix shape. Each memory cell 112 may be coupled to a word line WL and a bit line BL that are arranged to cross each other. The memory cell array region 110 may include an ECC cell array region 114 configured to store parity needed for correcting errors of data stored in the memory cell 112. The memory cell array region 120 may include an ECC cell array region 124 configured to store parity needed for correcting errors of data stored in the memory cell 122. In this case, the ECC cell array region 114 may be located at the center part of the memory cell array region 110, and the ECC cell array region 124 may be located at the center part of the memory cell array region 120. For example, each of the memory cell array regions 110 and 120 may be formed to use a 8-bit parity at intervals of 128-bit data, and 128-bit data cell arrays may be respectively located at both sides of each of the 8-bit ECC cell array regions 114 and 124.

The row driving region 210 is located at one side of the cell array region 110 in a row direction, and the row driving region 220 is located at one side of the cell array region 120 in the row direction. The row driving regions 210 and 220 include circuits configured to generate a word line selection signal for selecting memory cells 112 and 122 from which data is to be read or in which data is to be written.

The column driving region 300 is disposed between the memory cell array regions 110 and 120 in a column direction, and includes data input and output (input/output) (I/O) blocks 310 and 320 and ECC blocks 330 and 340. The data I/O blocks 310 and 320 may include circuits for storing data in memory cells 112 and 122 selected by word line selection signals generated from the row driving regions 210 and 220, and then reading the stored data. The ECC blocks 330 and 340 may include ECC circuits for correcting errors of data. In this case, the data I/O block 310 and the ECC block 330 may correspond to the memory cell array region 110, and the data I/O block 320 and the ECC block 340 may correspond to the memory cell array region 120.

The ECC blocks 330 and 340 may be arranged at the center part of the column driving region 300, and the data I/O blocks 310 and 320 may be arranged at both sides of the ECC blocks 330 and 340. For example, in the column driving region 300, the data I/O block 310 and the ECC block 330 corresponding to the memory cell array region 110 may be identical or substantially identical in arrangement structure to the data I/O block 320 and the ECC block 340 corresponding to the memory cell array region 120, and the data I/O block 310 and the ECC block 330 corresponding to the memory cell array region 110 may be arranged symmetrical to the data I/O block 320 and the ECC block 340 corresponding to the memory cell array region 120.

As described above, in the column driving region 300, the data I/O blocks 310 and 320 and the ECC blocks 330 and 340 in the memory cell array regions 110 and 120 contiguous to each other may have the same arrangement structure and may be symmetrical to each other, such that the same operation characteristics for the memory cell array regions 110 and 120 can be achieved and operational reliability of the semiconductor memory device can be guaranteed.

Figure 2:
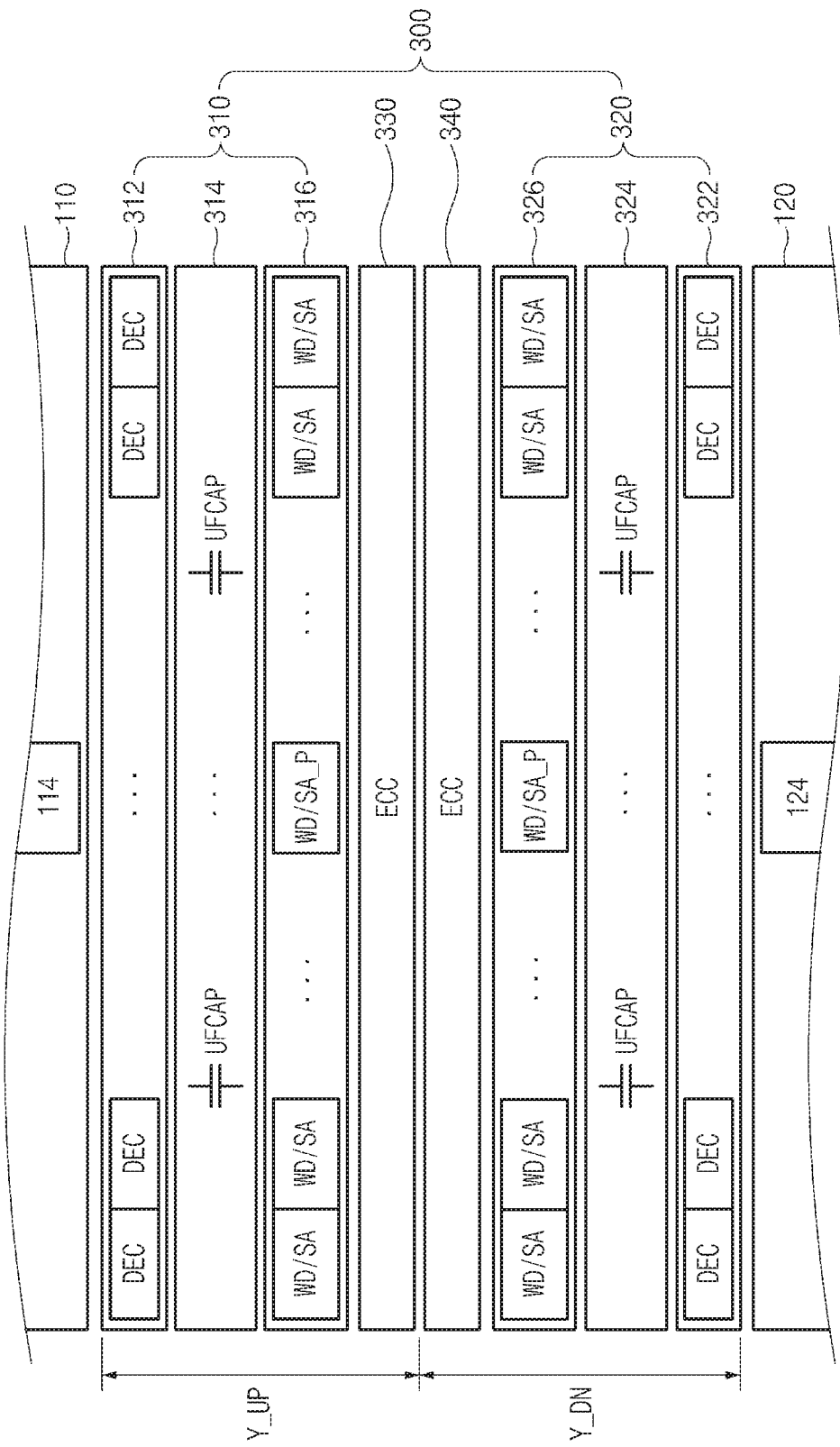
FIG. 2 is a block diagram illustrating a layout structure of a column driving region of FIG. 1.

FIG. 2 is a block diagram illustrating a layout structure of a column driving region of FIG. 1.

Referring to FIG. 2, the Y-HOLE region 300 may be classified into an upper column driving region (Y-UP) corresponding to the upper memory cell array region 110 and a lower column driving (Y_DN) region corresponding to the lower memory cell array 120.

The upper column driving (Y-UP) region may include an upper data I/O block 310 having circuits configured to store data in memory cells 112 of the memory cell array region 110 and read the stored data; and an upper ECC block 330 having ECC circuits configured to correct errors of data stored in the memory cell array region 110.

The upper data I/O block 310 may include a decoder block 312, a capacitor block 314, and a read and write (read/write) block 316. The decoder block 312 may be arranged contiguous to the corresponding memory cell array region 110, and may include decoders DECs, each of which generates a column selection signal by decoding a column address associated with the memory cell array region 110. The capacitor block 314 may be disposed between the decoder block 312 and the data read/write block 316, and may include a plurality of microfarad sized (μF-sized) capacitors UFCAPs.

The read/write block 316 may be disposed between the capacitor block 314 and the ECC block 330, and may include write driver/sense-amplifiers (WD/SA) and a parity write driver/sense amplifier (WD/SA_P). The write driver/sense-amplifiers (WD/SA) may sense and amplify (sense/amplify) data stored in the memory cells 112, may output the amplified data to a global I/O line, may amplify data received through the global I/O line, and may write the amplified data in the memory cells 112. The parity write driver/sense amplifier (WD/SA_P) may sense/amplify the parity stored in the ECC cell array region 114, may output the amplified parity to the ECC block 330, may amplify the parity generated from the ECC block 330, and may write the amplified parity in the ECC cell array region 114. The parity write driver/sense amplifier (WD/SA_P) may be arranged at the center part of the read/write block 316 in a manner that the parity write driver/sense amplifier (WD/SA_P) may correspond to the position of the ECC cell array region 114.

The Y_DN region may include a lower data I/O block 320 and a lower ECC block 340. The lower data I/O block 320 may include circuits for storing data in memory cells 122 of the memory cell array region 120 and reading the stored data. The lower ECC block 340 may include ECC circuits for correcting errors of data stored in the memory cell array region 120.

The lower data I/O block 320 may include a decoder block 322, a capacitor block 324, and a read/write block 326. The decoder block 322 may be arranged contiguous to the corresponding memory cell array region 120, and may include decoders DECs for generating a column selection signal by decoding a column address of the memory cell array region 120. The capacitor block 324 may be disposed between the decoder block 322 and the data read/write block 326, and may include a plurality of μF-sized capacitors UFCAPs. The read/write block 326 may be disposed between the capacitor block 324 and the ECC block 340, and may include write driver/sense-amplifiers (WD/SA) and a parity write driver/sense amplifier (WD/SA_P). The write driver/sense-amplifiers (WD/SA) may sense/amplify data stored in the memory cells 122, may output the amplified data to a global I/O line, may amplify data received through the global I/O line, and may write the amplified data in the memory cells 122. The parity write driver/sense amplifier (WD/SA_P) may sense/amplify the parity stored in the ECC cell array region 124, may output the amplified parity to the ECC block 340, may amplify the parity generated from the ECC block 340, and may write the amplified parity in the ECC cell array region 124. The parity write driver/sense amplifier (WD/SA_P) may be arranged at the center part of the read/write block 326 in a manner that the parity write driver/sense amplifier (WD/SA_P) may correspond to the position of the ECC cell array region 124.

The embodiments of the present disclosure may be characterized in a layout method of constituent elements 310~340 formed in the column driving region. The decoder, the capacitor, the write driver/sense amplifiers, and the ECC circuit formed in the corresponding region may operate in the same manner as in a conventional semiconductor memory device. As a result, detailed structures and operations of the above-mentioned constituent elements according to an embodiment of the present disclosure will herein be omitted for convenience of description and better understanding of the present disclosure.

As described above, ECC blocks 330 and 340 may be arranged in the column driving region 300, and may be located at the center part of the column driving region 300. For example, the upper ECC block 330 for the memory cell array region 110 may be identical in structure or substantially identical in structure to the lower ECC block 340 for the memory cell array region 120, and the upper ECC block 330 for the memory cell array region 110 may be symmetrical to the lower ECC block 340 for the memory cell array region 120. The upper data I/O block 310 for the memory cell array region 110 may be identical in structure or substantially identical in structure to the lower data I/O block 320 for the memory cell array region 120, and the upper data I/O block 310 for the memory cell array region 110 and the lower data I/O block 320 for the memory cell array region 120 may be symmetrically arranged at both sides of the ECC blocks 330 and 340.

As is apparent from the above description, the embodiments of the present disclosure may guarantee reliability of the semiconductor memory device when the ECC circuit is applied to the chip of the semiconductor memory device.

Figure 3:
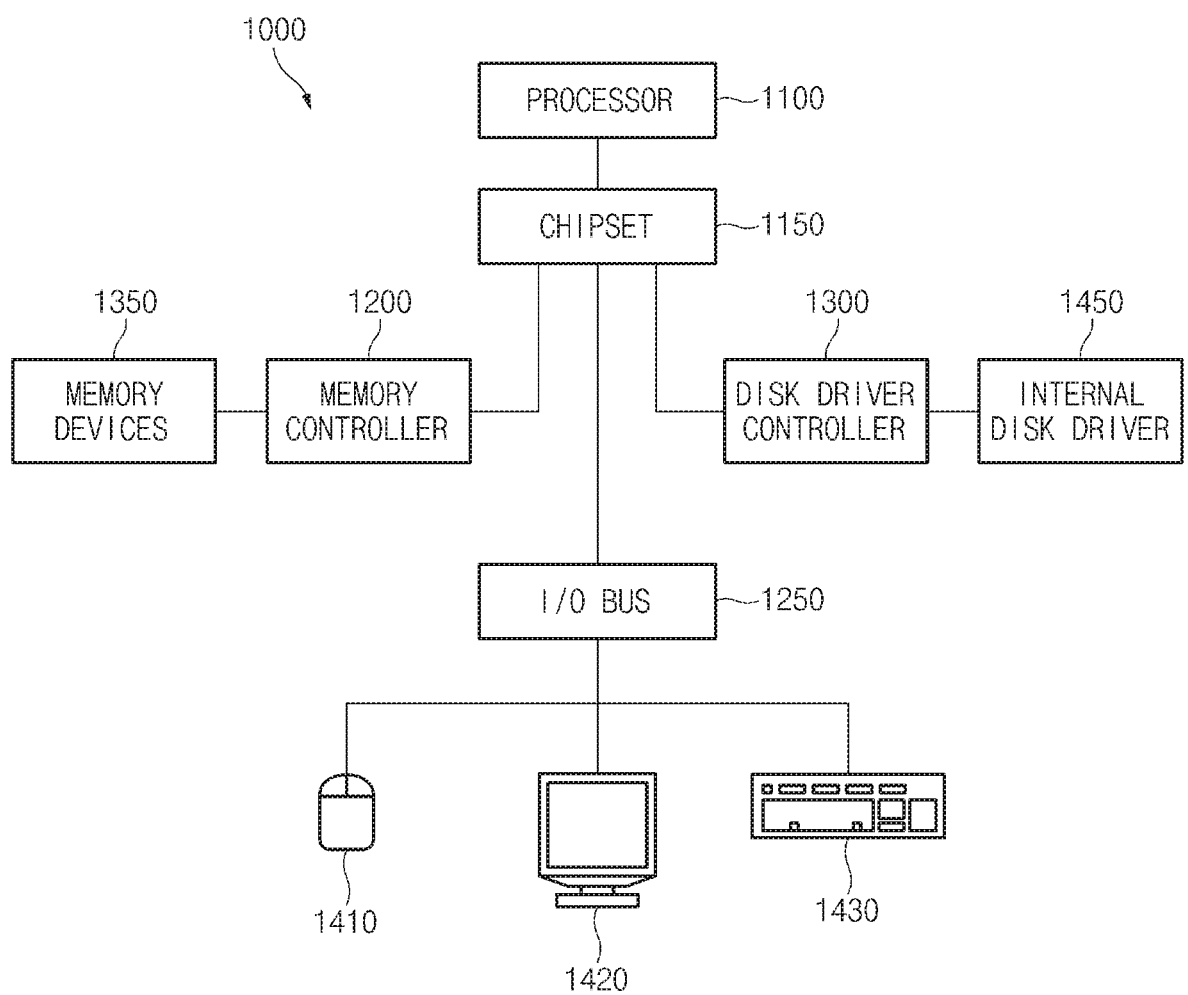
FIG. 3 illustrates a block diagram of an example of a representation of a system employing a semiconductor memory device with the various embodiments discussed above with relation to FIGS. 1 and 2.

The semiconductor memory devices as discussed above (see FIGS. 1-2) are particular useful in the design of other memory devices, processors, and computer systems. For example, referring to FIG. 3, a block diagram of a system employing a semiconductor memory device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory device as discussed above with reference to FIGS. 1-2. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory devices as discussed above with relation to FIGS. 1-2, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 3 is merely one example of a system including a semiconductor memory device as discussed above with relation to FIGS. 1-2. In alternate embodiments, such as, for example but not limited to, cellular phones or digital cameras, the components may differ from the embodiments illustrated in FIG. 3.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor are the embodiments limited to any specific type of semiconductor device. For example, the present disclosure may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor memory device comprising:
a first memory cell array region and a second memory cell array region next to the first memory cell array region, each of which includes memory cells configured for storing data; and
a column driving region disposed between the first memory cell array region and the second memory cell array region,
wherein the column driving region includes:
a first error correction code (ECC) block configured to perform error correction of data stored in the first memory cell array region;
a second error correction code (ECC) block configured to perform error correction of data stored in the second memory cell array region;
a first data input and output (input/output) (I/O) block disposed between the first memory cell array region and the first ECC block, and configured to read and write (read/write) data from and in (from/in) the first memory cell array region; and
a second data input/output (I/O) block disposed between the second memory cell array region and the second ECC block, and configured to read/write data from/in the second memory cell array region.

2. The semiconductor memory device according to claim 1, wherein each of the first memory cell array region and the second memory cell array region includes an ECC cell array region configured to store parity needed for the error correction.

3. The semiconductor memory device according to claim 2, wherein the ECC cell array region is arranged at a center part of each of the first memory cell array region and the second memory cell array region.

4. The semiconductor memory device according to claim 3,
wherein the first memory cell array region is configured to use a first number of parity at intervals of a first number of data cell arrays located at both sides of each of the first number of parity included in the ECC cell array region, and wherein the second memory cell array region is configured to use a second number of parity at internals of a second number of data cell arrays located at both sides of each of the second number of parity included in the ECC cell array region.

5. The semiconductor memory device according to claim 1, wherein the first and second ECC blocks are symmetrically arranged at a center part of the column driving region.

6. The semiconductor memory device according to claim 1, wherein the first and second ECC blocks are arranged such that an operational characteristic between the first memory cell array region and the first ECC block is substantially the same as an operational characteristic between the second memory cell array region and the second ECC block.

7. The semiconductor memory device according to claim 1, wherein the first ECC block and the second ECC block are substantially identical in structure to each other.

8. The semiconductor memory device according to claim 1, wherein the first data I/O block and the second data I/O block are arranged symmetrical to each other.

9. The semiconductor memory device according to claim 8, wherein the first data I/O block includes:

a first decoder block having decoders, each of which generates a column selection signal by decoding a column address for the first memory cell array region;

a first read/write block configured to sense and amplify (sense/amplify) data stored in the first memory cell array region and a parity needed for error correction of the data, output the amplified data and the amplified parity, amplify external input data and a parity generated from the first ECC block, and write the amplified external data and the amplified parity in the first memory cell array region; and a first capacitor block having a plurality of capacitors, and disposed between the first decoder block and the first read/write block.

10. The semiconductor memory device according to claim 9, wherein the first decoder block is disposed between the first capacitor block and the first memory cell array region, and wherein the first read/write block is disposed between the first ECC block and the first capacitor block.

11. The semiconductor memory device according to claim 8, wherein the second data I/O block includes:

a second decoder block having decoders, each of which generates a column selection signal by decoding a column address for the second memory cell array region;

a second read/write block configured to sense and amplify (sense/amplify) data stored in the second memory cell array region and a parity needed for error correction of the data, output the amplified data and the amplified parity, amplify external input data and a parity generated from the second ECC block, and write the amplified external data and the amplified parity in the second memory cell array region; and a second capacitor block having a plurality of capacitors, and disposed between the second decoder block and the second read/write block.

12. The semiconductor memory device according to claim 11, wherein the second decoder block is disposed between the second capacitor block and the second memory cell array region, and wherein the second read/write block is disposed between the second ECC block and the second capacitor block.

13. The semiconductor memory device according to claim 1, wherein the first data I/O block and the second data I/O block are substantially identical in structure to each other.

* * * * *